(12) United States Patent
Han et al.

(10) Patent No.: US 6,642,144 B2
(45) Date of Patent: Nov. 4, 2003

(54) METHOD OF FORMING MEMORY DEVICE HAVING CAPACITOR INCLUDING LAYER OF HIGH DIELECTRIC CONSTANT

(75) Inventors: Myoung-Sik Han, Kyunggi-do (KR); Kyung-Hyun Kim, Seoul (KR); Yong-Tak Lee, Yongin-shi (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/114,448

(22) Filed: Apr. 3, 2002

(65) Prior Publication Data

US 2002/0187613 A1 Dec. 12, 2002

(30) Foreign Application Priority Data

Jun. 7, 2001 (KR) ........................................ 2001-31676

(51) Int. Cl.[7] ........................................... H01L 21/7463
(52) U.S. Cl. ...................... 438/637; 438/675; 438/435; 438/639; 257/306; 257/295
(58) Field of Search ................. 438/243–247, 438/386–390, 637–640, 435–437, 830; 257/306, 295

(56) References Cited

U.S. PATENT DOCUMENTS 6,297,527 B1 * 10/2001 Agarwal et al. ............ 257/296

* cited by examiner

*Primary Examiner*—D Le
(74) *Attorney, Agent, or Firm*—Lee & Sterba, P.C.

(57) ABSTRACT

A method of fabricating a semiconductor device having a capacitor with a high dielectric constant layer includes a groove for an alignment key is formed together with a contact hole on a substrate; a conductive layer of tungsten is formed to fill the contact hole and cover the inner surface of the groove; a capping layer for use as an oxygen barrier is stacked on the conductive layer of tungsten; a planarization process is performed using CMP to leave the capping layer and the conductive layer of tungsten covering the inner surface of the groove to form a contact plug filling the contact hole; a capacitor bottom electrode layer is stacked to contact the top surface of the contact plug; a high dielectric constant layer is stacked on the bottom electrode layer; and an oxidation treatment is performed at a high temperature to crystallize the high dielectric constant layer.

13 Claims, 7 Drawing Sheets

METHOD OF FORMING MEMORY DEVICE HAVING CAPACITOR INCLUDING LAYER OF HIGH DIELECTRIC CONSTANT

BACKGROUND OF THE INVENTION

1. Field of the Invention

The present invention relates to a method of fabricating a memory device having a capacitor with a high dielectric constant layer in a ferroelectric random access memory (FRAM). More particularly, the present invention relates to a method of fabricating an alignment key that maintains its integrity during a step of crystallizing a high dielectric constant layer on a substrate during the formation a memory device having a capacitor with a high dielectric constant layer.

2. Description of the Related Art

As semiconductor devices become highly integrated, a memory device having a capacitor is required to include a capacitor having a small formation area and a large capacitance value. In a conventional method of realizing a capacitor having a small formation area and a large capacitance value, a dielectric layer having a high dielectric constant is used. Particularly, a method of forming a nonvolatile memory, which does not require a refresh function and has a high operation characteristic, has been recently studied wherein a ferroelectric material is used as a high dielectric constant material.

Representative high dielectric constant materials are metal compounds of a titanic acid such as PZT and BST. In order that these compounds may have a high dielectric constant, or ferroelectricity, a crystallization should be performed on an amorphous structure that is easily formed and treated on a substrate. Alternatively, another crystallization having a ferroelectric property should be performed. For the conventional crystallization of these materials, the materials require treatment at a high temperature, under an oxygen ambient, for a certain time. When these materials are treated under an oxygen ambient at a high temperature, a problem occurs in that a previously formed part of a semiconductor device is influenced by the process condition.

For example, a storage node contact hole is formed at an interlayer insulation layer and filled with polysilicon to form a contact plug. Conductors, which are not easily oxidized, such as platinum and iridium, are formed on the contact plug as a capacitor bottom electrode. A high dielectric constant layer is then formed on the bottom electrode and crystallization is performed under an oxygen ambient at a high temperature. At this time, even if the polysilicon contact plug is covered with layers of platinum and the like, these layers may not function as oxygen barriers effectively. Thus, when annealing is performed at a high temperature, a top of the contact plug is easily oxidized. When the top of the contact plug is oxidized, the top of the contact plug becomes a nonconductor, so that the resistance of the contact is increased and a problem occurs in the operation of the capacitor device.

FIG. 1 through FIG. 3 illustrate cross-sectional views of a conventional embodiment that induces a problem during the crystallization of a high dielectric constant layer material. In this conventional embodiment, in order to increase conductivity of a contact plug, tungsten is used instead of polysilicon.

Referring to FIG. 1, a transistor structure including a gate electrode 13 is formed on a substrate 10 at a cell region. Additionally, a first interlayer insulation layer 15, a bit line 17, a bit line contact 20 and a second interlayer insulation layer 19 are formed. A storage node contact hole 21 is formed in interlayer insulation layers 15 and 19, and the contact hole is filled with a tungsten layer 23 by a tungsten chemical vapor deposition (CVD).

At this time, an alignment key is formed at a scribe line or a peripheral region of a chip for use in a subsequent pattern alignment process. The alignment key is made by forming a relatively wide window or a groove 24 by etching the interlayer insulation layer 19 concurrent with the formation of the storage node contact hole 21. Thus, when the tungsten CVD is performed, the tungsten layer 23 fills the narrow storage node contact hole 21 to form a plug. Additionally, the tungsten layer 23 is conformally stacked on the inner sidewalls of the groove 24 forming the alignment key, and the width of the groove 24 narrows.

Referring to FIG. 2, a chemical mechanical polishing (CMP) process is performed with respect to the tungsten at the cell region so that the tungsten layer above the second interlayer insulation layer 19 is removed and only a storage node contact plug 231 remains. An iridium/iridium oxide layer 25 and a platinum layer 27 are then stacked as a bottom electrode, and $BST((Ba,Sr)TiO_3)$ or $PZT(Pb(Zr,Ti)O_3)$ is stacked as a high dielectric constant layer 29. At this time, except for a residual tungsten layer 233 on the inner surface of the groove forming the alignment key, the tungsten layer is removed by the CMP process. The iridium/iridium oxide layer 25, the platinum layer 27, and the high dielectric constant layer 29, such as $BST((Ba,Sr)TiO_3)$ or $PZT(Pb(Zr,Ti)O_3)$, are conformally stacked according to an undulation formed by the groove at the substrate.

Referring to FIG. 2 and FIG. 3, the substrate of the FIG. 2 is thermally treated under an oxygen ambient at a temperature of 700° C. The thermal treatment forms a crystallized high dielectric constant layer 291. In the cell region, some oxygen may diffuse through the bottom electrode at the top of the tungsten layer forming the contact plug 231. Diffusion of oxygen, however, is limited due to the presence of other layers 25, 27 and 29 on the contact plug 231 and the narrow width of contact plug in comparison with the formation depth of the contact plug 231. Accordingly, no significant problem in the conductivity of the contact plug 231 occurs. At the groove where the alignment key is formed, however, the residual tungsten layer 233 formed in the groove and covering the inner surface of the groove is contacted with the oxygen ambient through a wide area, so there is significant oxygen inflow. Thus, the tungsten is oxidized at a groove 235 forming the alignment key, which causes the tungsten to expand in volume. As a result, the groove is filled with a tungsten oxide layer, a lifted bottom electrode layer and a crystallized high dielectric constant layer 291, such as a PZT layer. Consequently, selectivity of the alignment key is decreased, and in the case of aligning a substrate for patterning the crystallized high dielectric constant layer 291 and the bottom electrode in a subsequent process, it is difficult to fit the alignment key and an overlay key of a mask.

SUMMARY OF THE INVENTION

An advantage of the present invention is the capability to overcome a problem of sustaining an alignment key formed in a method of fabricating a semiconductor device including a process of crystallizing a ferroelectric layer or other high dielectric constant layer under an oxygen ambient at a high temperature.

It is a feature of an embodiment of the present invention to provide a method of forming a memory device capable of preventing the oxidation and expansion of a conductive layer covering an inner sidewall of a groove during a high dielectric constant layer crystallization process, which may occur even if the groove for an alignment key, which is formed in an interlayer insulation layer during the formation of a contact hole, is covered with a conductive layer of tungsten used during the formation of a contact plug.

Another feature of an embodiment of the present invention provides a method of forming a memory device having an alignment key in which no problems occur during crystallization of a high dielectric constant layer, even when a conductive layer of tungsten is used as a material for a contact plug for a capacitor bottom electrode.

Still another feature of an embodiment of the present invention provides a method wherein a groove for an alignment key is formed concurrently with a contact hole at a substrate; a conductive layer, such as a tungsten layer, is formed to fill the contact hole and cover the inner surface of the groove; a capping layer for use as an oxygen barrier is conformally stacked on the conductive layer; the capping layer and the conductive layer are planarized by a CMP process thereby leaving the capping layer and the conductive layer covering the inner sidewall of the groove and the conductive layer contact plug filling the contact hole; a capacitor bottom electrode layer is stacked to contact a top surface of the contact plug; a high dielectric constant layer is stacked on the bottom electrode layer; and an oxidation treatment is performed at a high temperature to crystallize the high dielectric constant layer.

In the present invention, it is presumed that a width of the groove is larger than a width of the contact hole. Further, it is presumed that, during the stacking of the high dielectric constant layer, the groove formed for an alignment key conventionally keeps its form if the width of the groove is narrowed.

In the present invention, since the contact hole is filled prior to the stacking of the conductive layer, the capping layer of a cell region is entirely removed during planarization leaving only the contact plug. Thus, the capping layer may be formed of various layers having a function of an oxygen barrier. For example, the capping layer may be formed of an oxide layer or a nitride layer. The capping layer may also be formed of a multiple layer structure. When the capping layer is formed of a multiple layer structure, it is preferable that the lowest bottom layer, which directly contacts with the conductive layer, may function as a buffer layer in order to decrease stress between the conductive layer and the upper capping layer. For example, the buffer layer may be formed of an oxide layer and the upper capping layer may be formed of a silicon nitride layer.

In the present invention, the planarization process is performed by conventional CMP. When the CMP is performed with respect to the capping layer and the conductive layer, a multi-step CMP process may be performed in order to increase the efficiency of the CMP. For example, when the capping layer is an oxide layer, the CMP step of removing the capping layer is an oxide CMP, which may be performed using a silica slurry for removing $SiO_2$, and the CMP step of removing the conductive layer of tungsten is a tungsten CMP. The CMP steps may be performed by controlling a material of a polishing head and slurry.

These and other features of the present invention will be readily apparent to those of ordinary skill in the art upon review of the detailed description that follows.

DETAILED DESCRIPTION OF THE INVENTION

Figure 1:
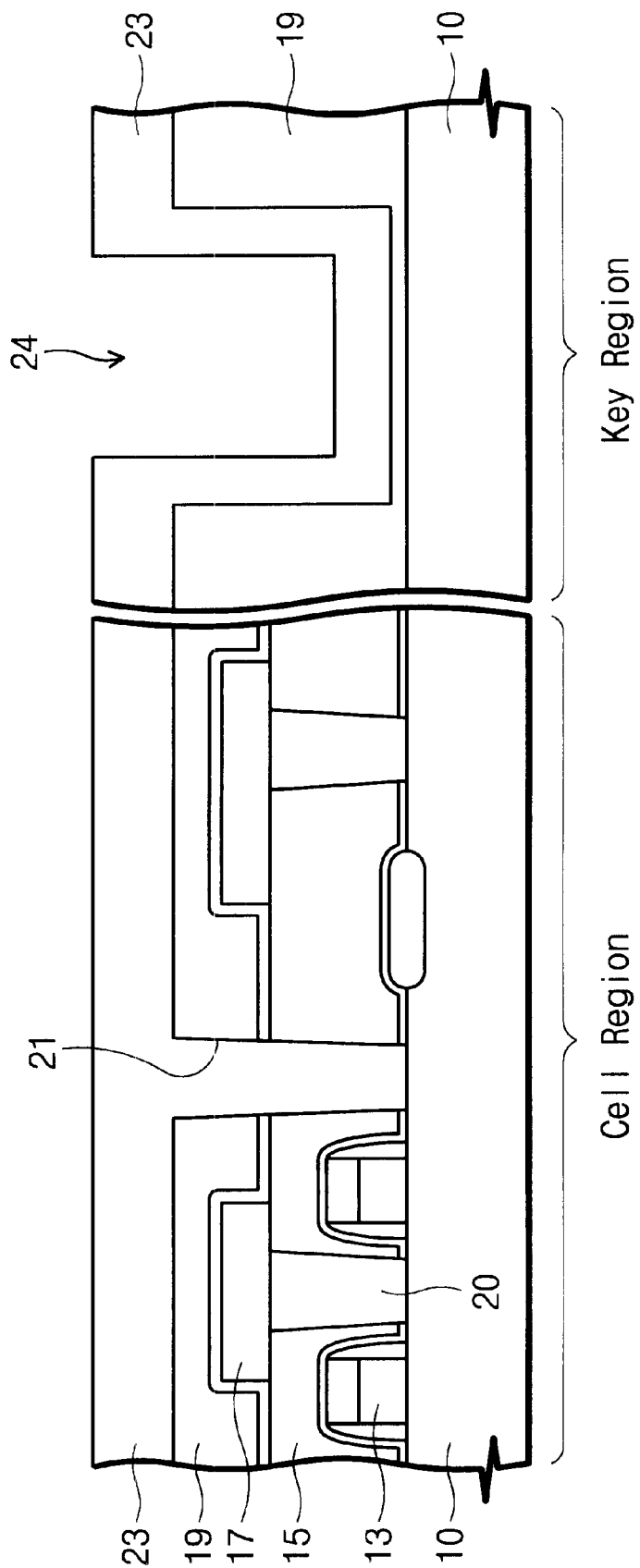
FIG. 1 through FIG. 3 illustrate cross-sectional views of a conventional embodiment inducing a problem during the crystallization of a high dielectric constant layer material.
Figure 2:
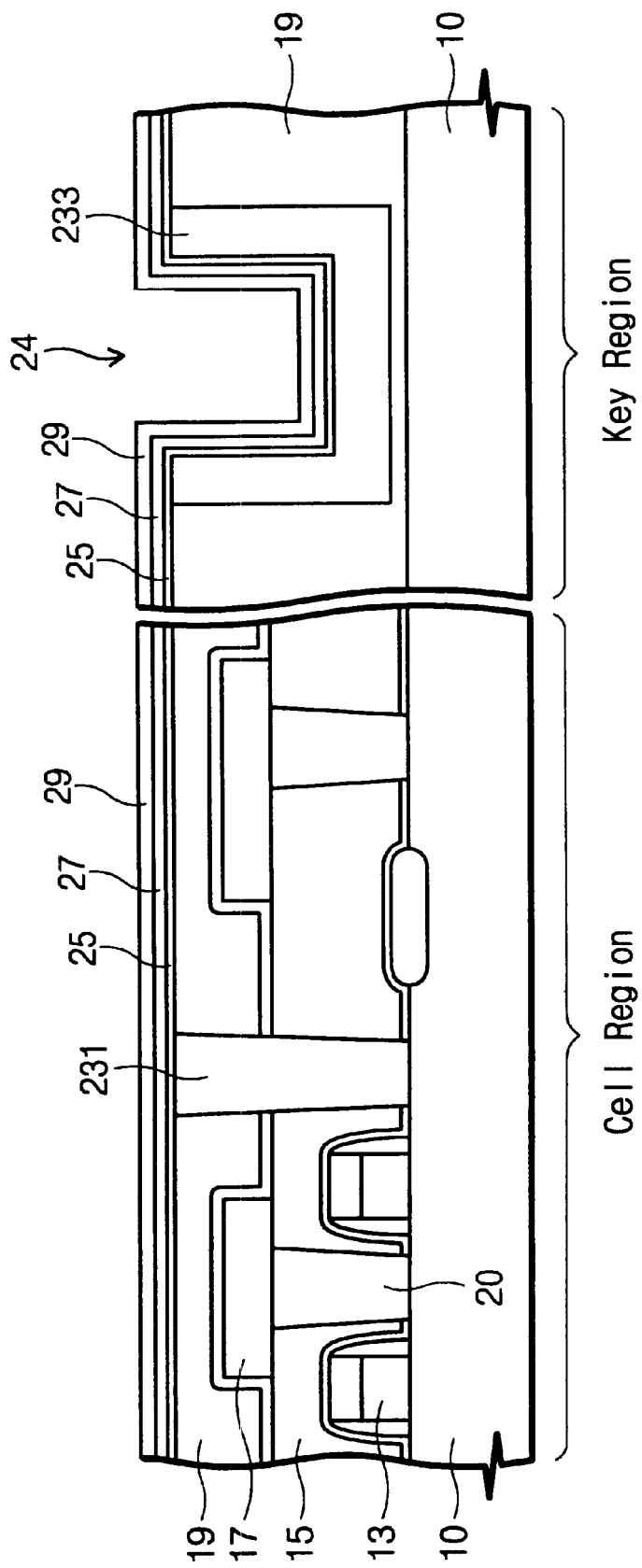
Figure 3:
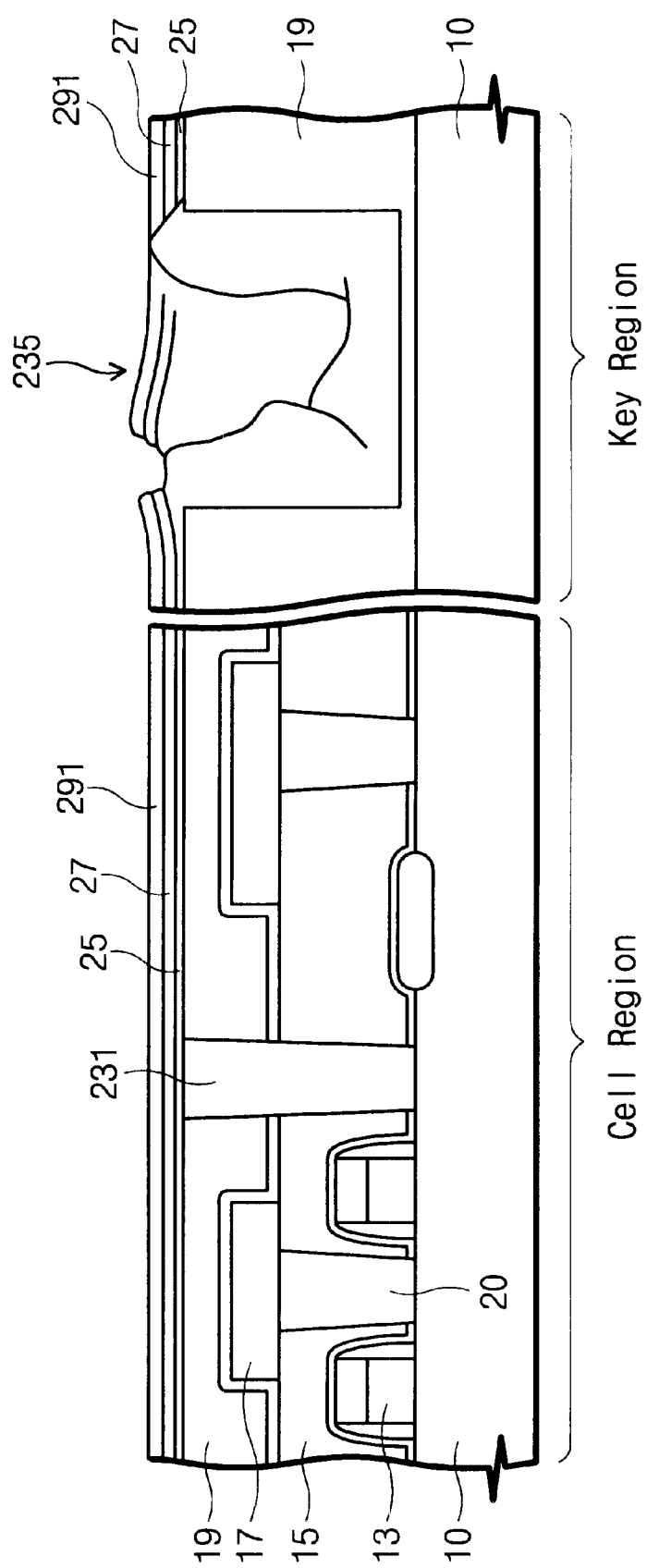

Korean Patent Application No. 2001-31676, filed on Jun. 7, 2001, and entitled: "Method of Forming Memory Device Having Capacitor Including Layer of High Dielectric Constant," is incorporated by reference herein in its entirety.

The present invention will now be described more fully hereinafter with reference to the accompanying drawings, in which preferred embodiments of the present invention are shown. The present invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout the figures.

Figure 4:
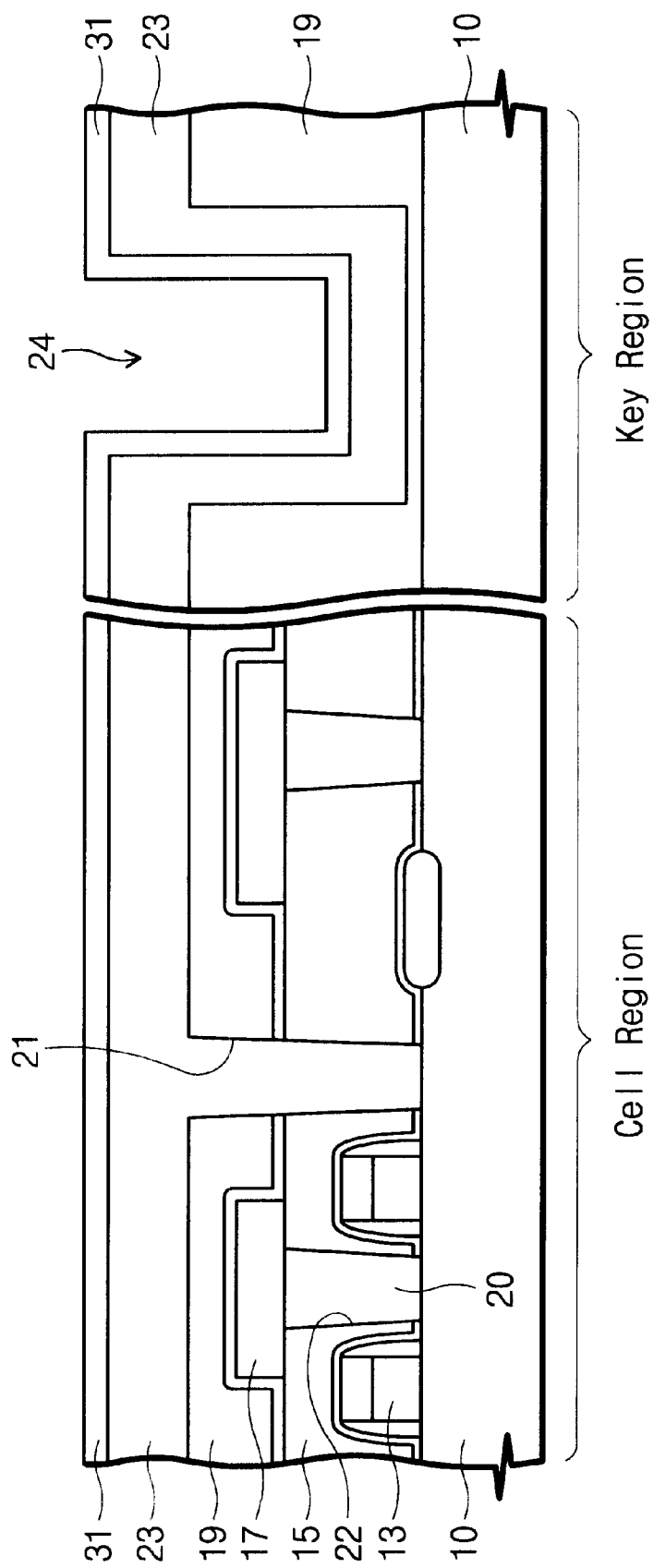
FIG. 4 through FIG. 7 illustrate cross-sectional views of a cell region and a groove region at various stages in a method according to an embodiment of the present invention.

Referring to FIG. 4, a MOS transistor structure including a gate electrode 13 is formed on a substrate 10. A first interlayer insulation layer 15 is stacked and planarized. A bit line contact hole 22 is formed in the first interlayer insulation layer 15 in a drain region of the MOS transistor through patterning, and a bit line 17 and a bit line contact 20 are formed by stacking and patterning a conductive layer.

Next, a second interlayer insulation layer 19 is stacked and planarized. A storage node contact hole 21 is formed on a source region of the MOS transistor by patterning with respect to the first and second interlayer insulation layers 15 and 19. Concurrent to the formation of the storage node contact hole 21, a groove 24 having a larger width than the width of the storage node contact hole 21 is formed to form an alignment key at a scribe line region.

Subsequently, a tungsten layer 23 is stacked on the structure by a CVD method. The tungsten layer 23 has a thickness sufficient to fill the storage node contact hole 21 but insufficient to fill the groove 24 forming the alignment key. A capping layer 31 is formed on the tungsten layer 23. The capping layer 31 is formed by sequentially stacking a silicon oxide layer and a silicon nitride layer. The silicon nitride layer is capable of preventing the diffusion of oxygen, and the silicon oxide layer decreases the stress between the silicon nitride layer and the tungsten layer and increases adhesive force. Even when the capping layer 31 is stacked on the tungsten layer 23, the groove 24 is not completely filled by the silicon oxide layer and the silicon nitride layer, so that it continues to function as an alignment key.

Figure 5:
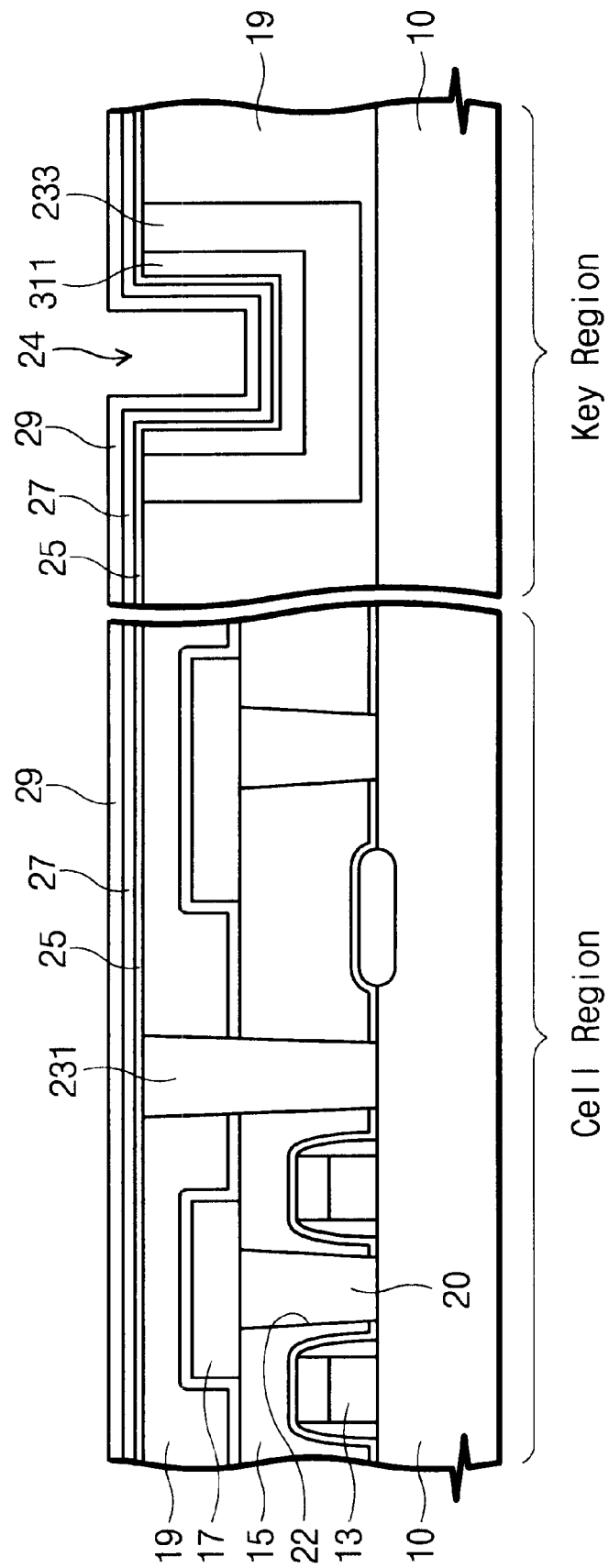

Referring to FIG. 4 and FIG. 5, the CMP is performed on the structure where the capping layer 31 is stacked. Preferably, the CMP is divided into two processes. The first CMP process planarizes the silicon nitride layer and the silicon oxide layer using a silica slurry. The second CMP process is the tungsten CMP for removing the tungsten layer. In this way, two steps of a CMP process are performed to remove the capping layer 31 and the tungsten layer 23 stacked on the second interlayer insulation layer 19, thereby leaving only a contact plug 231 in the contact hole 21. The capping layer 31 and the tungsten layer 23 stacked on the second interlayer insulation layer 19 are similarly removed from the peripheral part of the groove 24 forming the alignment key at the scribe line. Thereafter, a residual tungsten layer 233 and a residual capping layer 311 are stacked on the inner surface of the groove 24.

An iridium/iridium oxide layer 25 is first stacked on the structure where the top surface of the contact plug 231 is exposed. Then, a platinum layer 27 is stacked thereon. Together layers 25 and 27 function as a capacitor bottom electrode of a FRAM, wherein the iridium/iridium oxide layer 25 acts as a kind of a wetting layer. In selecting a material to form the capacitor bottom electrode, it is preferable to use a metal that is not easily oxidized, even under oxidation ambient at high temperature, as in case of forming a subsequent ferroelectric layer, or a metal material having good conductivity even at the oxidized state. A suitable material, for example, is at least one material selected from the group consisting of platinum, ruthenium, iridium, rhodium, osmium, palladium, ruthenium oxide and iridium oxide.

After the capacitor bottom electrode layer is formed, a high dielectric constant layer 29 is formed as a ferroelectric layer on the bottom electrode layer. Suitable ferroelectric materials include SrTiO3, BaTiO3, (Ba,Sr)TiO3, Pb(Zr,Ti)O3, SrBi2Ta2O9, (Pb,La)(Zr,Ti)O3, and Bi4Ti3O12. In order to form a ferroelectric material, there are several alternates to a coating method. For example, it is possible to employ a sputtering, a CVD or an ALD method. The coating method employs the sol-gel change and is frequently used in the case of forming a flat-type capacitor electrode.

Figure 6:
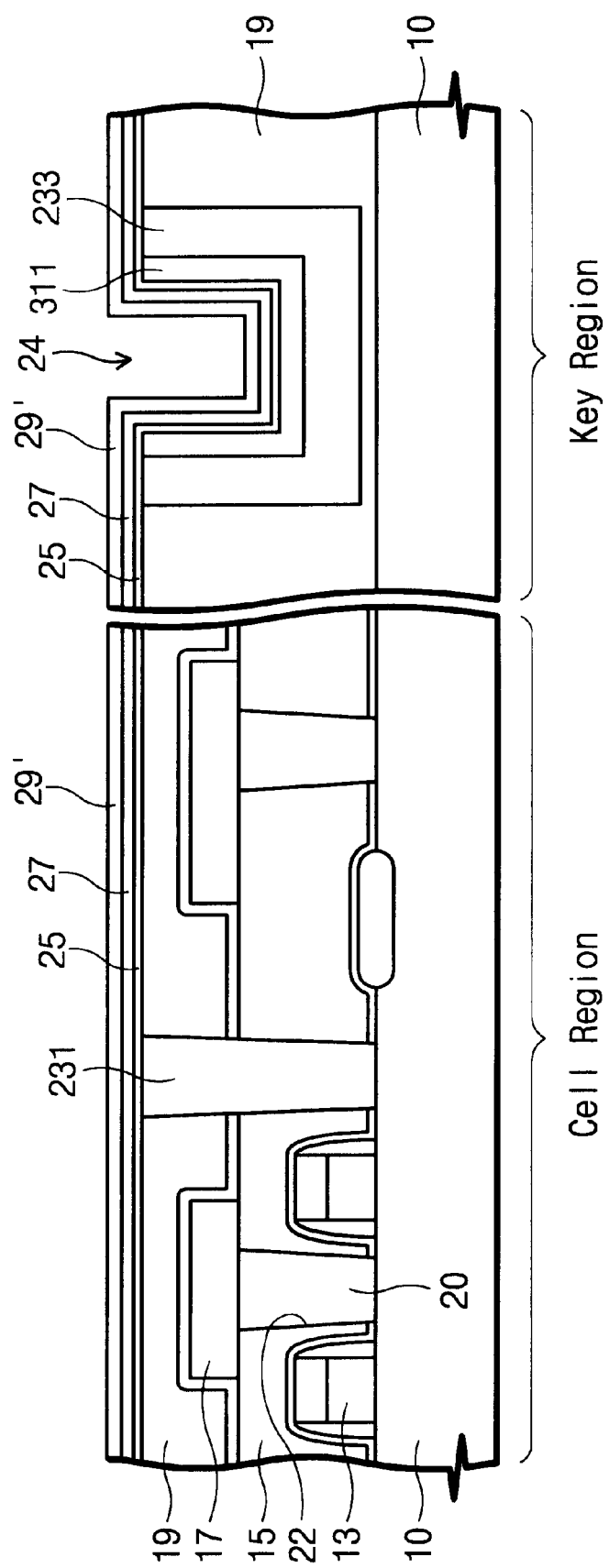

Referring to FIG. 5 and FIG. 6, in order to form a ferroelectric array of the high dielectric constant layer 29, crystallization of the high dielectric constant layer is performed at a temperature of approximately 700 to 750° C. under an oxidation ambient, such as oxygen gas. In the crystallization step, the process time and inner pressure may be controlled together with temperature. At the region of the alignment key, most of the residual tungsten layer 233 is covered by a residual capping layer 311, and only a narrow region at the top of the residual tungsten layer 233 is covered with a capacitor bottom electrode layer and a ferroelectric layer 29'. Thus, tungsten oxidation by diffusion of oxygen is prevented and breakdown of the alignment key by volume expansion is avoided.

Figure 7:
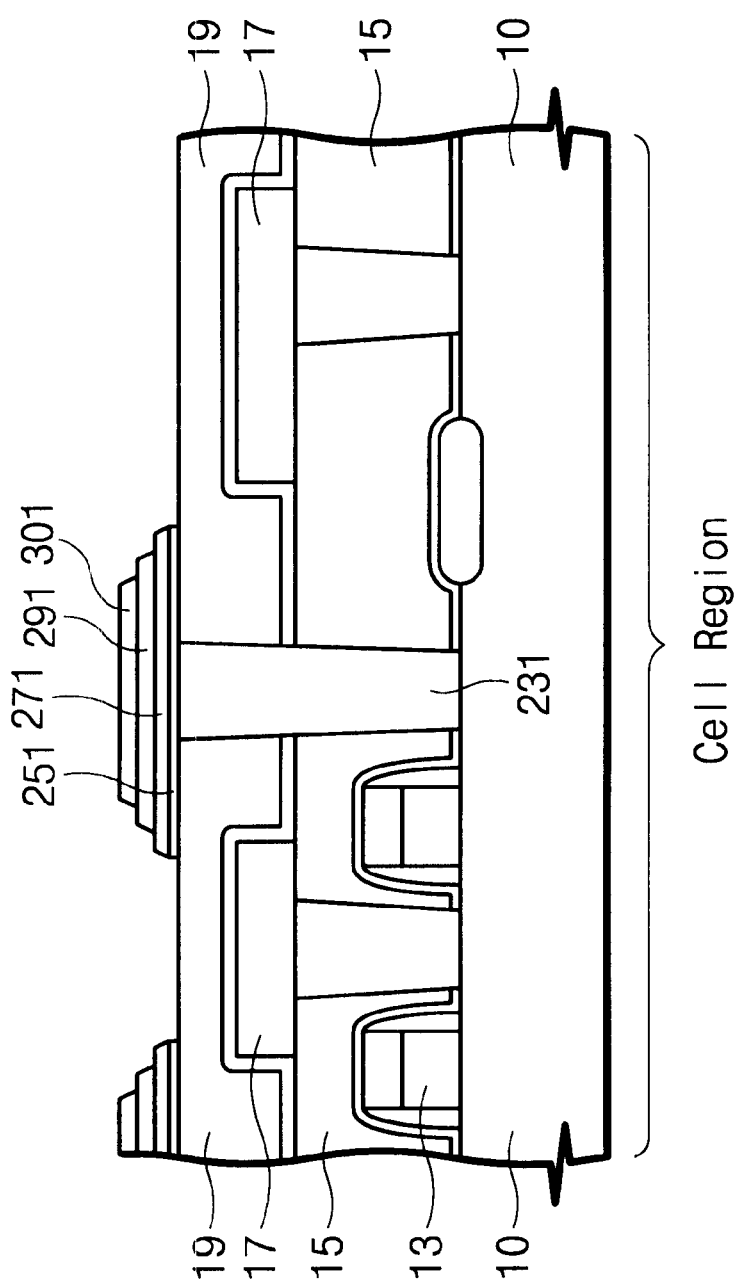

Referring to FIG. 7, a capacitor top electrode layer is formed on the crystallized ferroelectric layer. The capacitor top electrode layer may be formed of a metal or a metal compound, which is similar to the capacitor bottom electrode layer. A ferroelectric capacitor including an iridium/iridium oxide layer pattern 251, a platinum layer pattern 271, a ferroelectric layer pattern 291 and a top electrode pattern 301 is formed at the cell region through patterning. In a subsequent step (not illustrated), the capacitor top electrode may be connected to a capacitor line through a contact hole passing through the interlayer insulation layer formed on the capacitor top electrode.

According to the present invention, in a memory device having a capacitor including a high dielectric constant layer, it is possible to form a tungsten contact plug, which has good conductivity and is connected to a capacitor bottom electrode, without any damage to an alignment key during crystallization of a high dielectric constant layer.

A preferred embodiment of the present invention has been disclosed herein and, although specific terms are employed, they are used in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of forming a memory device having a capacitor including a high dielectric constant layer, comprising:

forming a groove for an alignment key concurrently with a contact hole on a substrate;

forming a conductive layer to fill the contact hole and cover the inner surface of the groove;

conformally stacking a capping layer as an oxygen barrier on the conductive layer;

planarizing the capping layer and the conductive layer by chemical mechanical polishing to leave the conductive layer and the capping layer only covering the inner surface of the groove and on a bottom and inner sidewalls of the contact hole, thereby forming a contact plug filling the contact hole;

stacking a capacitor bottom electrode layer to contact the top surface of the contact plug;

stacking a high dielectric constant layer on the bottom electrode layer; and performing an oxidation treatment at a high temperature to crystallize the high dielectric constant layer.

2. The method as claimed in claim 1, wherein the conductive layer is formed of a tungsten layer.

3. The method as claimed in claim 1, wherein the capping layer is formed of a multiple layer structure.

4. The method as claimed in claim 3, wherein the multiple layer structure is formed of a buffer layer contacting the conductive layer and an oxygen barrier layer formed on the buffer layer.

5. The method as claimed in claim 4, wherein the buffer layer is formed of a silicon oxide layer and the oxygen barrier layer is formed of a silicon nitride layer.

6. The method as claimed in claim 1, wherein the planarization step is performed by a two-step chemical mechanical polishing.

7. The method as claimed in claim 6, wherein the two-step chemical mechanical polishing comprises a chemical mechanical polishing step of etching the capping layer and a chemical mechanical polishing step of etching the conductive layer.

8. The method as claimed in claim 7, wherein a silica slurry is used in the chemical mechanical polishing step of etching the capping layer.

9. The method as claimed in claim 1, wherein the high dielectric constant layer is subjected to the oxidation treatment at a high temperature.

10. The method as claimed in claim 1, wherein the performing the oxidation treatment at a high temperature to crystallize the high dielectric constant layer is performed under ambient of oxygen at a temperature of approximately 700 to 750° C.

11. The method as claimed in claim 1, wherein the bottom electrode layer is formed of at least one material selected from the group consisting of platinum, ruthenium, iridium, rhodium, osmium, palladium, ruthenium oxide and iridium oxide.

12. The method as claimed in claim 1, wherein the high dielectric constant layer is formed of a material selected from a group consisting of $SrTiO_3$, $BaTiO_3$, $(Ba,Sr)TiO_3$, $Pb(Zr,Ti)O_3$, $SrBi_2Ta_2O_9$, $(Pb,La)(Zr,Ti)O_3$, and $Bi_4Ti_3O_{12}$.

13. The method as claimed in claim 1, wherein a width of the groove is larger than a width of the contact hole.

* * * * *